United States Patent
Hsu

(10) Patent No.: US 7,381,616 B2
(45) Date of Patent: Jun. 3, 2008

(54) METHOD OF MAKING THREE DIMENSIONAL, 2R MEMORY HAVING A 4F2 CELL SIZE RRAM

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 156 days.

(21) Appl. No.: 11/510,427

(22) Filed: Aug. 24, 2006

(65) Prior Publication Data

US 2006/0284281 A1    Dec. 21, 2006

Related U.S. Application Data

(60) Continuation-in-part of application No. 11/249,881, filed on Oct. 12, 2005, now Pat. No. 7,342,824, which is a division of application No. 10/720,890, filed on Nov. 24, 2003, now Pat. No. 7,009,278.

(51) Int. Cl.
*H01L 21/336* (2006.01)

(52) U.S. Cl. ............................. 438/258; 257/E21.665; 438/295

(58) Field of Classification Search .................... 438/3, 438/258, 295, 691; 257/E21.665, E27.006, 257/E29.323
See application file for complete search history.

(56) References Cited

U.S. PATENT DOCUMENTS

| | | | |
|---|---|---|---|
| 7,009,278 B2 * | 3/2006 | Hsu | ........................... 257/536 |
| 7,236,389 B2 * | 6/2007 | Hsu | ........................... 365/148 |
| 7,291,878 B2 * | 11/2007 | Stipe | ........................... 257/296 |
| 2007/0132049 A1 * | 6/2007 | Stipe | ........................... 257/421 |

* cited by examiner

*Primary Examiner*—Thao P. Le
(74) *Attorney, Agent, or Firm*—David C. Ripma

(57) ABSTRACT

A method of fabricating a multi-level 3D memory array includes: preparing a wafer and peripheral circuits thereon; layers of metal, memory resistor material, and metal are deposited, patterned and etched. The steps of the method of the invention are repeated for N levels of a memory array.

6 Claims, 6 Drawing Sheets

Fig. 1 *(PRIOR ART)*
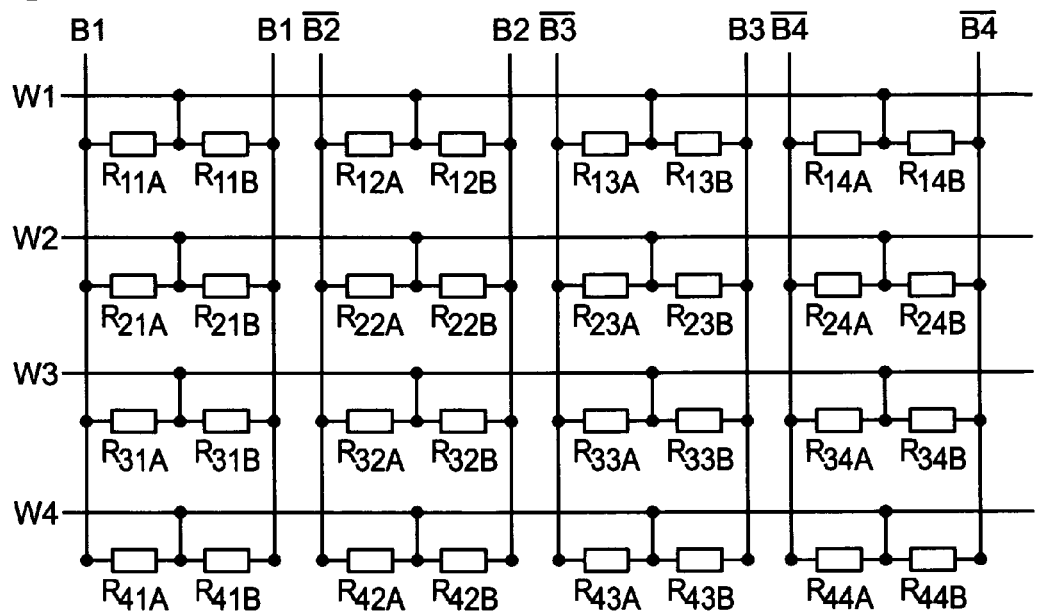
Fig. 2 *(PRIOR ART)*
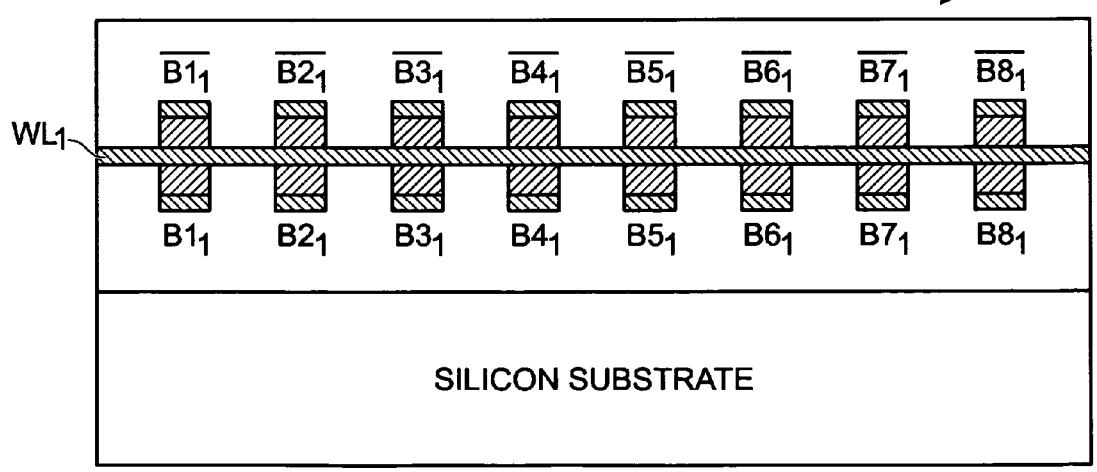

METHOD OF MAKING THREE DIMENSIONAL, 2R MEMORY HAVING A 4F2 CELL SIZE RRAM

RELATED APPLICATION

This application is a continuation-in-part of Ser. No. 11/249,881, filed Oct. 12, 2005 now U.S. Pat. No. 7,342,824 for Method of Fabricating a 3D RRAM, which is a divisional of Ser. No. 10/720,890, filed Nov. 24, 2003, having the same title, now U.S. Pat. No. 7,009,278, which are incorporated herein by reference.

FIELD OF THE INVENTION

This invention relates to thin film resistance memory device for non-volatile memory array application, and specifically to a method of fabricating a multi-level RRAM.

BACKGROUND OF THE INVENTION

The prior art, including the above-identified related application, describes three dimensional RRAM memory arrays having two resistors (2R) per cell, in which two bit lines of a given cell are located in the same plane. The memory resistors are fabricated on top of the two bit lines, while the word line is fabricated on top of the memory resistors. Thus the plan area is relatively large. A disadvantage of the 3-D RRAM of the related application is a large cell size. This disclosure demonstrate a 2-R Cell RRAM array with cell size of $4F^2$ and a method of making this memory array.

SUMMARY OF THE INVENTION

A method of fabricating a multi-level 3D memory array includes: a. preparing a wafer and peripheral circuits thereon; b. depositing, patterning and etching in a first direction, a first metal layer, a first memory resistor layer and a second metal layer on the wafer; c. depositing a barrier insulator layer and an oxide layer on and between the etched first metal layer, first memory resistor layer and second metal layer, and smoothing the oxide layer by CMP to the level of the second metal layer; d. patterning, and etching in a second direction substantially perpendicular to the first direction, the first and second metal layers and the first memory resistor layer to form first bit lines from the first metal layer and to form first word lines from the second metal layer; e. depositing a barrier insulator layer and an oxide layer on and between the etched first metal layer, first memory resistor layer and second metal layer, and smoothing the oxide layer by CMP to the level of the second metal layer; f. depositing a second memory resistor layer and a third metal layer; g. patterning and etching in the second direction the third metal layer and the second memory resistor layer; h. depositing a barrier insulator layer and an oxide layer on and between the etched third metal layer and second memory resistor layer, and smoothing the oxide layer by CMP to the level of the third metal layer; i. patterning and etching in the first direction the third metal layer and the first memory resistor layer to form second bit lines from the third metal layer; j. depositing a barrier insulator layer and an oxide layer on and between the etched third metal layer and second memory resistor layer, and smoothing the oxide layer by CMP to the level of the third metal layer; k. depositing a layer of oxide; and j. repeating steps b through k for N levels of memory array.

It is an object of the invention to providing a reliable resistive non-volatile suitable for three-dimensional structure ultra high-density memory array.

Another object of the invention is to provide such a memory, having a cell size of only $4F^2$, which is the minimum size that is possible for an integrated circuit.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a 2R memory cell array equivalent circuit of the prior art and a RRAM fabricated according to the MOI.

FIG. 2 depicts a prior art single level, 2R cell memory array.

DETAILED DESCRIPTION OF THE PREFERRED EMBODIMENTS

Figure 3:
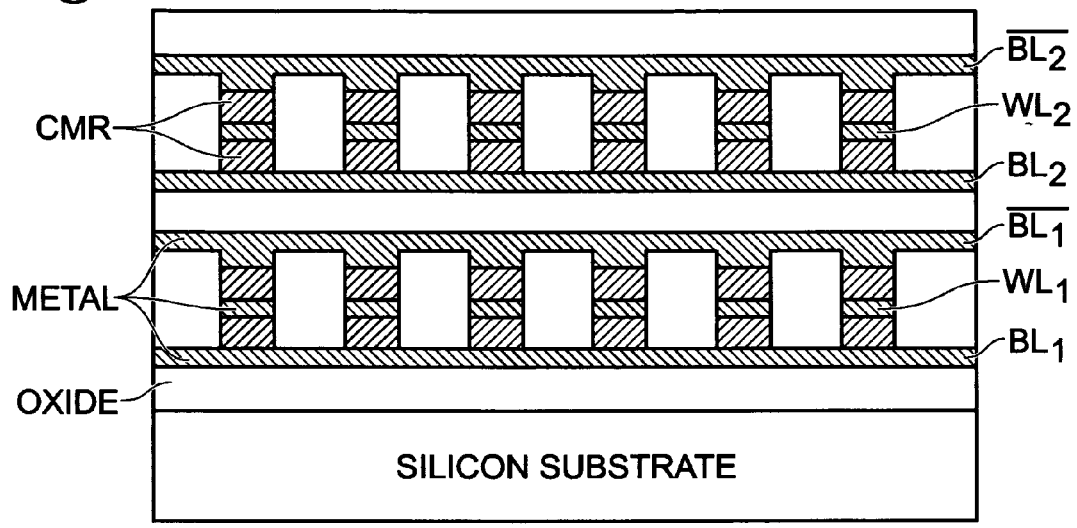
FIG. 3 is a cross-section view of the $4F^2$ 2R cell memory array of the invention.

This disclosure presents a vertical 2R memory cell array and method of fabrication the memory array having a cell size of $4F^2$. The equivalent circuit of a given level of the memory array is shown in FIG. 1, generally at 10, which is identical to that of the related application but which is also depictional of a RRAM constructed according to the method of the invention. The cross-section view of a single level memory array taken along $W_2$ is shown in FIG. 2, generally at 12, while FIG. 3 depicts a two-level memory array. The $4F^2$ cell size is achieved by stacking two memory resistors of a memory cell constructed according to he method of the invention, generally at 14. Surprisingly, there is no critical photo alignment issue, as is shown by the following process sequence, as depicted in block diagram form in FIG. 4.

Figure 4A:
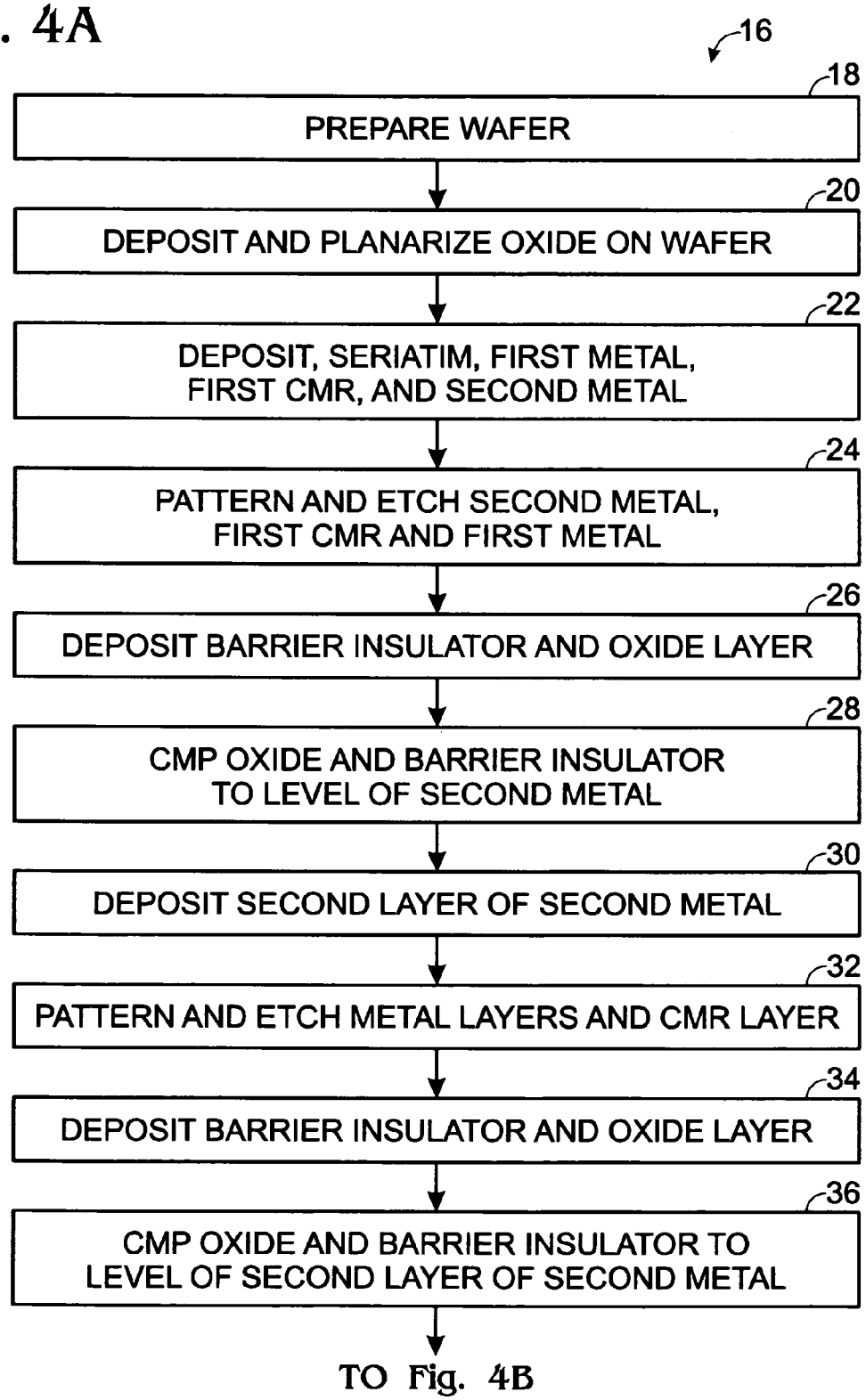
FIG. 4 is a block diagram of the method of the invention, which consists of FIG. 4A and FIG. 4B.
Figure 4B:
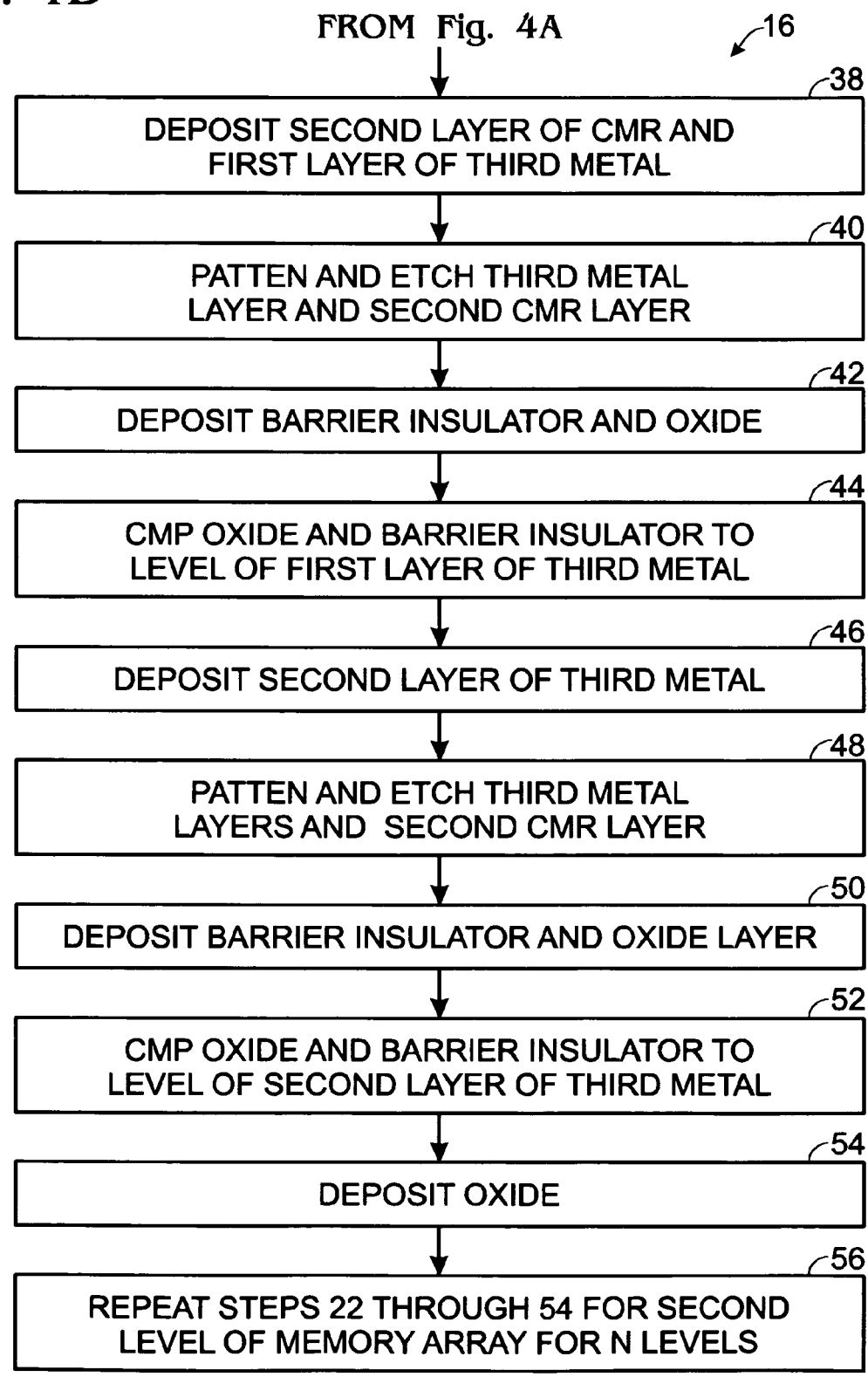

Referring now to FIG. 4, the method of the invention is depicted generally at 16. Any peripheral electronic circuits are fabricated during preparation of a silicon substrate, step 18. Portion of any peripheral circuits may be fabricated under the memory array area. Oxide is deposited, and CMPd, to planarize the wafer surface. A first metal layer, such as Au, Ag, Pt, W, Cu, Ti, Ir, and $TiN_x$, and a first colossal magnetoresistance (CMR) layer, or a layer of other suitable memory resistor material, are deposited, followed by deposition of a second metal layer, such as Au, Ag, Pt, W, Cu, Ti, Ir, and $TiN_x$, step 22. The structure thus far is covered with photoresist and patterned to form bit lines, and the second metal layer is etched, as is the CMR and first metal layers, step 24. The photoresist is then removed.

A barrier insulator, such as $Si_3N_4$, and $Al_2O_3$, is deposited, followed by deposition of another oxide layer, step 26. The thickness of oxide layer is 1.5 to 2 times the total thickness of the combined first metal, second metal and CMR layers. The oxide layer is smoothed by CMP, stopping at the depth of the second metal layer, step 28. Another layer of the second metal is then deposited, referred to herein as metal 2', step 30. The first metal layer forms the first bit line and the combination of second metal layer and Metal 2' form the first word line.

Photo resist is applied and patterned, followed by etching of CMR layer, step 32.

The photoresist is removed, and a barrier insulator layer and an oxide layer are deposited, step 34, wherein the oxide layer has a thickness of between about 1.5 to 2 times that of the total thickness of CMR layer and combined second metal layers. The structure is smoothed by CMP, stopping at the level of oxide layer and metal 2' layer, step 36.

A second CMR layer is deposited, as is a third metal layer, step 38, which will become part of a second bit line. The structure is covered with photoresist and pattered to form the second bit lines, and the third metal layer and the second CMR layer is etched, step 40. The alignment of this photo step is not critical because the second memory resistor does not have to perfectly align with the first memory resistor.

A barrier insulator layer and an oxide layer are deposited, step 42. The oxide layer is smoothed by CMP, stopping at the depth of third metal layer, step 44. The thickness of the oxide is 1.5 to 2 times of the total thickness of CMR layer and the third metal layer. Another layer of the third metal is deposited, as Metal 3', step 46. The structure is covered with photoresist, patterned, and etched, removing portions of the combined third metal and Metal 3' layers, as well as portions of CMR layer. The photoresist is removed, step 48.

Again, a barrier insulator layer and an oxide layer are deposited, step 50. This oxide layer has a thickness of between about 1.5 to 2 times of the thickness of the combined second CMR layer, the third metal layer and Metal 3' layer. Oxide layer is smoothed by CMP, stopping at the depth of Metal 3', step 52. Another layer of oxide is deposited, step 54, which has a thickness of between about 50 nm to 300 nm. Alternately, the two oxide layers in this step may be combined, and deposited as a single layer of oxide.

The thickness of the barrier insulator layers s is between about 5 nm to 20 nm; while the thickness of the CMR layers is between about 10 nm to 200 nm. The thickness of the metal layers is between about 50 nm to 200 nm. The processes related to FIGS. 5-12 are repeated to from a second level of the memory array. Additional n levels of array may be fabricated by repeating the fabrication steps, step 56.

Figure 5:
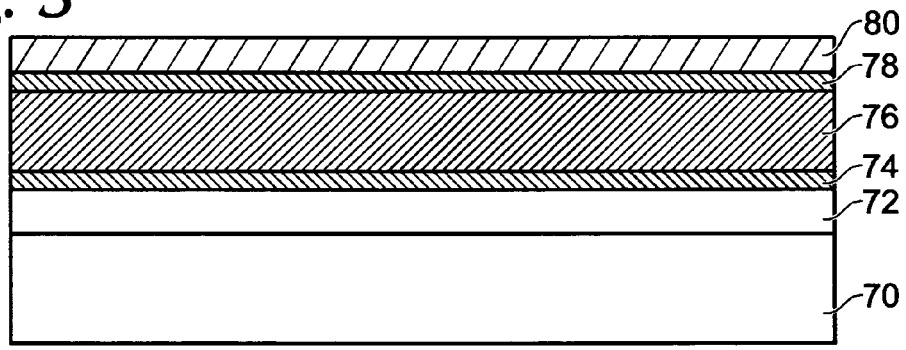
FIGS. 5-12 depict steps in the method of the invention of fabricating a $4F^2$ 2R memory cell.

Referring now to FIG. 5, any peripheral electronic circuits are fabricated during preparation of a silicon substrate 70. Portion of any peripheral circuits may be fabricated under the memory array area. Oxide 72 is deposited, and CMPd, to planarize the wafer surface. A first metal layer 74 and a first CMR layer 76, or other suitable memory resistor material, are deposited, followed by deposition of a second metal layer 78. The structure thus far is covered with photoresist 80 and patterned to form bit lines.

Figure 6:
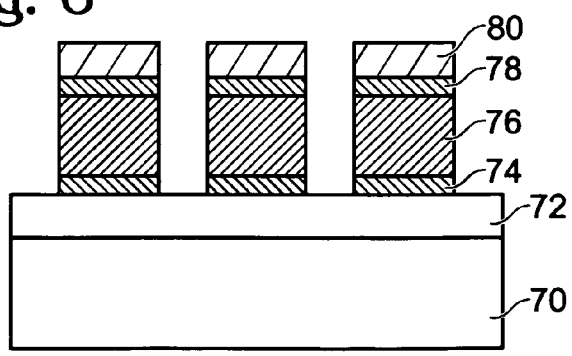

Referring to FIG. 6, second metal layer 78 is etched, as is CMR layer 76 and first metal layer 74.

Figure 7:
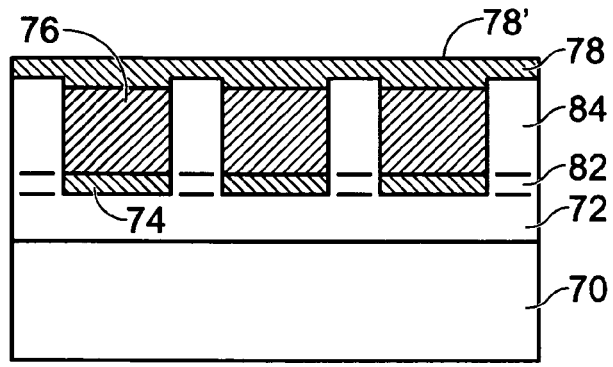

Referring to FIG. 7, which is view taken from the right side of FIG. 6, a barrier insulator layer 82, such as $Si_3N_4$, and $Al_2O_3$, is deposited, followed by deposition of an oxide layer 84. The thickness of oxide layer is 1.5 to 2 times the total thickness of the combined first metal 74, second metal 78 and CMR 76 layers. Oxide layer 84 is smoothed by CMP, stopping at the depth of second metal layer 78. Another layer of the second metal 78' is then deposited, referred to herein as Metal 2'. First metal layer 74 forms the first bit line and the combination of second metal layer 78 and Metal 2' 78' form the first word line.

Figure 8:
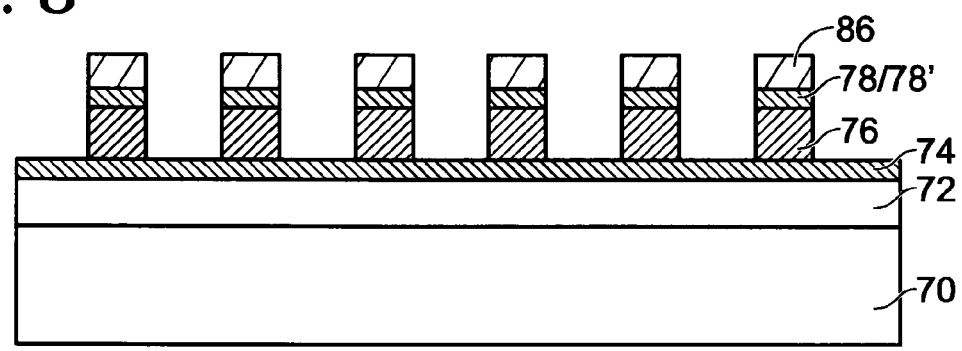

As shown in FIG. 8, which is a top plan view of the structure constructed according to the method of the invention, photo resist 86 is applied and patterned, followed by etching of CMR layer 76.

Figure 9:
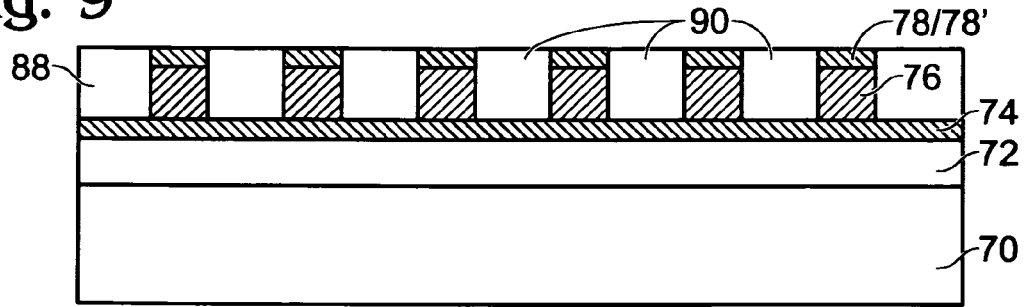

Referring to FIG. 9, photoresist 86 is removed, and a barrier insulator layer 88 and an oxide layer 90 are deposited, wherein oxide layer 90 has a thickness of between about 1.5 to 2 times that of the total thickness of CMR layer 76 and combined second metal layers, 78/78'. The structure is smoothed by CMP, stopping at the level of oxide layer 90 and Metal 2' layer 78'.

Figure 10:
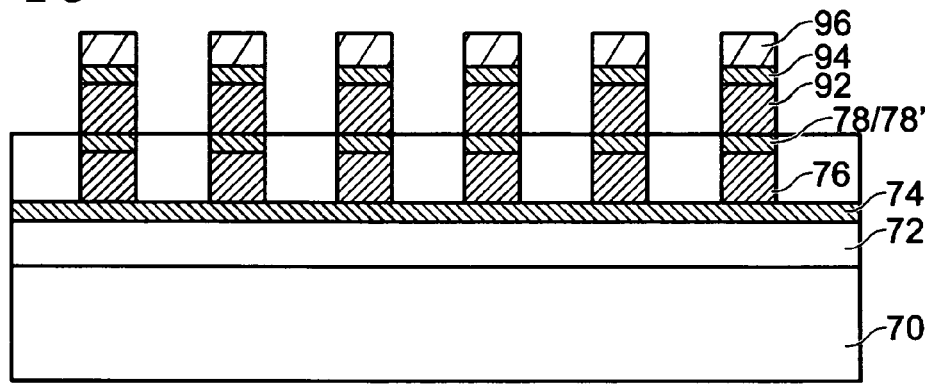

Viewing FIG. 10, a second CMR layer 92 is deposited, as is a third metal layer 94, which will become part of a second bit line. The structure is covered with photoresist 96 and pattered to form the second bit lines. Third metal layer 94 and second CMR layer 92 are etched. The alignment of this photo step is not critical because the second memory resistor does not have to perfectly aligned with the first memory resistor.

Figure 11:
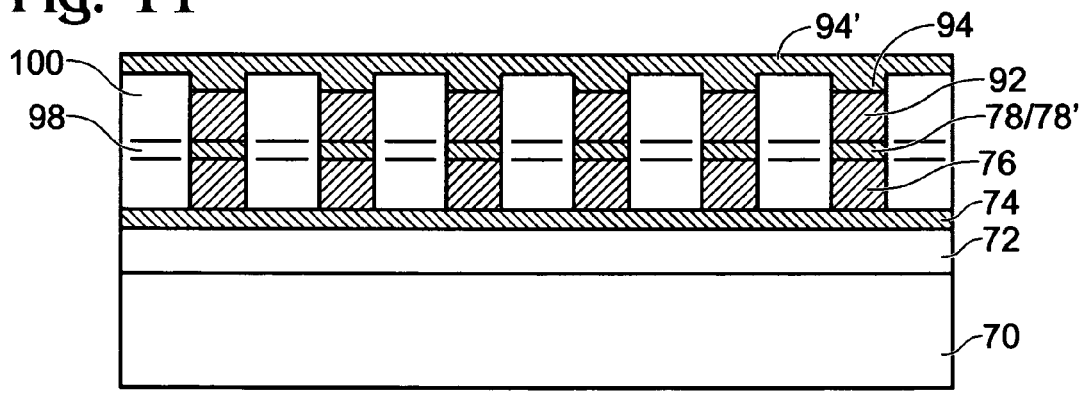
Figure 12:
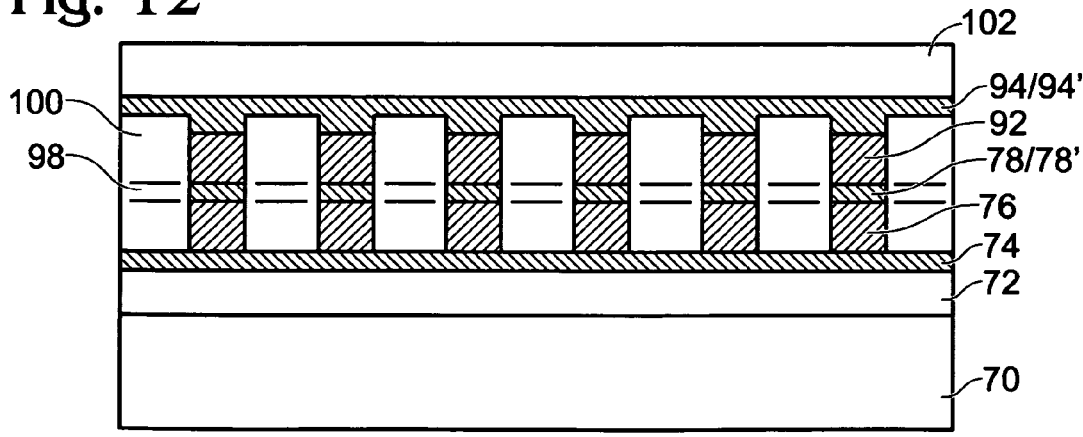

Referring to FIG. 11, a barrier insulator layer 98 and an oxide layer 100 are deposited. The oxide layer is smoothed by CMP, stopping at the depth of third metal layer 94. The thickness of the oxide is 1.5 to 2 times of the total thickness of CMR layer 92 and third metal layer 94. Another layer of the third metal is deposited, as Metal 3' 94'. The structure is covered with photoresist, patterned, and etched, removing portions of the combined third metal layer 94 and Metal 3' layer 94', as well as portions of CMR layer 92. The photoresist is removed, Again, a barrier insulator layer and an oxide layer 102 are deposited, as shown in FIG. 12. Oxide layer 102 has a thickness of between about 1.5 to 2 times of the thickness of the combined second CMR layer 92, the third metal layer 94 and Metal 3' layer 94'. Oxide layer 102 is smoothed by CMP, stopping at the depth of Metal 3' 94'. Another layer of oxide is deposited, which has a thickness of between about 50 nm to 300 nm. Alternately, the two oxide layers in this step may be combined, and deposited as a single layer of oxide, which oxide layer(s) are represented herein by reference number 102.

The thickness of all barrier insulator layers described herein is between about 5 nm to 20 nm; while the thickness of all CMR layers is between about 10 nm to 200 nm. The thickness of the metal layers is between about 50 nm to 200 nm. The processes related to FIGS. 5-12 are repeated to from a second level of the memory array. Additional n levels of array may be fabricated by repeating the fabrication steps associated with FIGS. 5-12 n-times.

Thus, a three dimensional, 2R memory having a $4F^2$ cell size RRAM and method of making the same has been disclosed. It will be appreciated that further variations and modifications thereof may be made within the of the invention as defined in the appended claims.

I claim:

1. A method of fabricating a multi-level 3D memory array, comprising:
   a. preparing a wafer and peripheral circuits thereon;
   b. depositing, patterning and etching in a first direction, a first metal layer, a first memory resistor layer and a second metal layer on the wafer;
   c. depositing a barrier insulator layer and an oxide layer on and between the etched first metal layer, first memory resistor layer and second metal layer, and smoothing the oxide layer by CMP to the level of the second metal layer;
   d. patterning, and etching in a second direction substantially perpendicular to the first direction, the first and second metal layers and the first memory resistor layer to form first bit lines from the first metal layer and to form first word lines from the second metal layer;

e. depositing a barrier insulator layer and an oxide layer on and between the etched first metal layer, first memory resistor layer and second metal layer, and smoothing the oxide layer by CMP to the level of the second metal layer;

f. depositing a second memory resistor layer and a third metal layer;

g. patterning and etching in the second direction the third metal layer and the second memory resistor layer;

h. depositing a barrier insulator layer and an oxide layer on and between the etched third metal layer and second memory resistor layer, and smoothing the oxide layer by CMP to the level of the third metal layer;

i. patterning and etching in the first direction the third metal layer and the first memory resistor layer to form second bit lines from the third metal layer;

j. depositing a barrier insulator layer and an oxide layer on and between the etched third metal layer and second memory resistor layer, and smoothing the oxide layer by CMP to the level of the third metal layer;

k. depositing a layer of oxide; and j. repeating steps b through k for N levels of memory array.

2. The method of claim 1 wherein said depositing a second metal layer includes depositing the second metal layer in two steps, with a depositing step for the barrier insulator and the oxide, and smoothing the oxide by CMP between the deposition steps for the second metal.

3. The method of claim 1 wherein said depositing a third metal layer includes depositing the third metal layer in two steps, with a depositing step for the barrier insulator and the oxide, and smoothing the oxide by CMP between the deposition steps for the third metal.

4. A method of fabricating a multi-level 3D memory array, comprising:

a. preparing a wafer and peripheral circuits thereon;

b. depositing, patterning and etching in a first direction, a first metal layer, a first CMR layer and a second metal layer on the wafer;

c. depositing a barrier insulator layer and an oxide layer on and between the etched first metal layer, first CMR layer and second metal layer, and smoothing the oxide layer by CMP to the level of the second metal layer;

d. patterning, and etching in a second direction substantially perpendicular to the first direction, the first and second metal layers and the first CMR layer to form first bit lines from the first metal layer and to form first word lines from the second metal layer;

e. depositing a barrier insulator layer and an oxide layer on and between the etched first metal layer, first CMR layer and second metal layer, and smoothing the oxide layer by CMP to the level of the second metal layer;

f. depositing a second CMR layer and a third metal layer;

g. patterning and etching in the second direction the third metal layer and the second CMR layer;

h. depositing a barrier insulator layer and an oxide layer on and between the etched third metal layer and second CMR layer, and smoothing the oxide layer by CMP to the level of the third metal layer;

i. patterning and etching in the first direction the third metal layer and the first CMR layer to form second bit lines from the third metal layer;

j. depositing a barrier insulator layer and an oxide layer on and between the etched third metal layer and second CMR layer, and smoothing the oxide layer by CMP to the level of the third metal layer;

k. depositing a layer of oxide; and j. repeating steps b through k for N levels of memory array.

5. The method of claim 4 wherein said depositing a second metal layer includes depositing the second metal layer in two steps, with a depositing step for the barrier insulator and the oxide, and smoothing the oxide by CMP between the deposition steps for the second metal.

6. The method of claim 4 wherein said depositing a third metal layer includes depositing the third metal layer in two steps, with a depositing step for the barrier insulator and the oxide, and smoothing the oxide by CMP between the deposition steps for the third metal.

* * * * *